US006938231B2

(12) United States Patent
Yoshida et al.

(10) Patent No.: US 6,938,231 B2
(45) Date of Patent: Aug. 30, 2005

(54) METHOD AND SYSTEM FOR DESIGNING CIRCUIT LAYOUT

(75) Inventors: Shiro Yoshida, Tokyo (JP); Hirokazu Tohya, Tokyo (JP)

(73) Assignee: NEC Corporation (JP)

( * ) Notice: Subject to any disclaimer, the term of this patent is extended or adjusted under 35 U.S.C. 154(b) by 187 days.

(21) Appl. No.: 10/469,328

(22) PCT Filed: Feb. 26, 2002

(86) PCT No.: PCT/JP02/01733

§ 371 (c)(1),
(2), (4) Date: Aug. 27, 2003

(87) PCT Pub. No.: WO02/069207

PCT Pub. Date: Sep. 6, 2002

(65) Prior Publication Data

US 2004/0073880 A1 Apr. 15, 2004

(30) Foreign Application Priority Data

Feb. 28, 2001 (JP) ........................... 2001-053444

(51) Int. Cl.$^7$ .............................................. G06F 17/50
(52) U.S. Cl. ...................... 716/5; 716/2; 716/7; 716/10
(58) Field of Search ........................... 716/2, 5, 7, 10, 716/15

(56) References Cited

U.S. PATENT DOCUMENTS

| 6,327,542 B1 | * | 12/2001 | McBride ..................... 702/64 |
| 6,385,758 B1 | * | 5/2002 | Kikuchi et al. ............... 716/2 |
| 6,594,805 B1 | * | 7/2003 | Tetelbaum et al. ............ 716/5 |
| 2003/0200516 A1 | * | 10/2003 | Eisenberg et al. ............ 716/5 |

FOREIGN PATENT DOCUMENTS

| JP | 5-67174 A | 3/1993 |
| JP | 6-203102 A | 7/1994 |
| JP | 9-139573 A | 5/1997 |
| JP | 11-040915 A | 2/1999 |
| JP | 2001-119154 A | 4/2001 |
| JP | 2001-222573 A | 8/2001 |

OTHER PUBLICATIONS

Ymeri, Hasan et al., "New closed formula for frequency dependent resistance and inductance of IC interconnects on silicon substrate", IOP Publishing Ltd, UK. obtained from http://ej.iop.org/links/q48/D+xQgxjNckZ4Du6gNfd+QA/jm1319.pdf, pp. 283–286.*

List of Prior Art Documents with document origin prepared by applicant.

International Search Report relating to application PCT/JP02/01733 dated Mar. 26, 2002.

English translation of Abstract for Japanese Application No. JP 5-67174 A.

English translation of Abstract for Japanese Application No. JP 9-139573 A.

English translation of Abstract for Japanese Application No. JP 2001-119154 A.

English translation of Abstract for Japanese Application No. JP 2001-222573 A.

English translation of Abstract for Japanese Application No. JP 6-203102 A.

* cited by examiner

*Primary Examiner*—Stacy A. Whitmore
(74) *Attorney, Agent, or Firm*—Ostrolenk, Faber, Gerb & Soffen, LLP

(57) ABSTRACT

A circuit layout design method capable of an LSI circuit or an electronic printed circuit board free of electromagnetic interference is provided. The layout design method according to the invention includes a quasi-stationary circuit reduction step of deviding an entire circuit represented by a net list and a part library into a plurality of quasi-stationary closed circuits having a reduced size so that an intensity of an electromagnetic wave radiated from each of the quasi-stationary closed circuits is not more than a predetermined value; a wiring constraint condition calculation step of calculating constraint conditions for each of wirings mutually connecting the plurality of quasi-stationary closed circuits so that the intensity of the electromagnetic wave radiated from each of the wirings is not more than the predetermined value; and a layout step of laying out parts and the wirings based on the net list and the parts library so as to satisfy the constraint conditions.

24 Claims, 10 Drawing Sheets

FIG.4
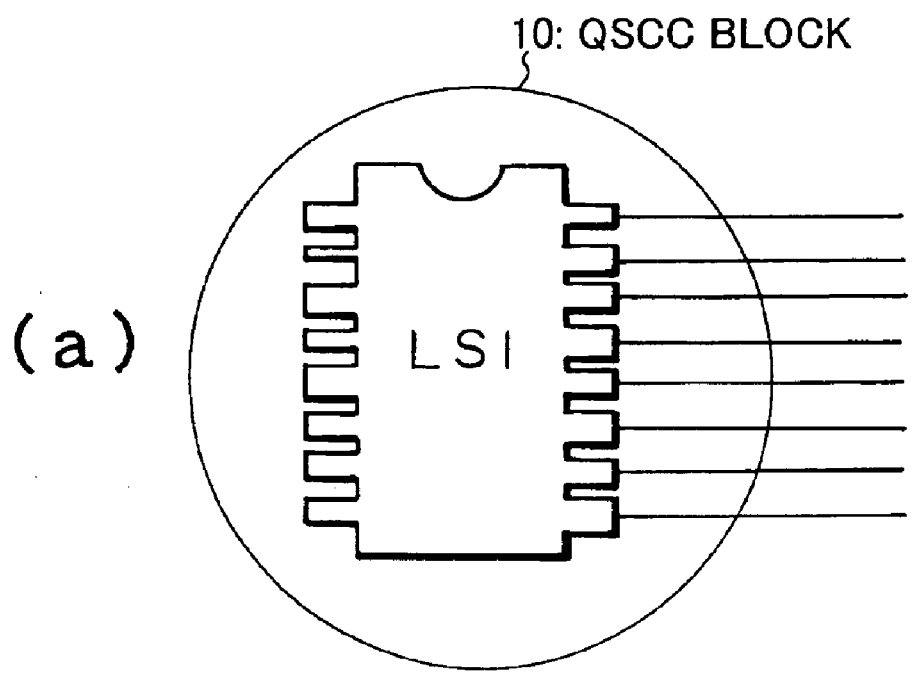
(a)
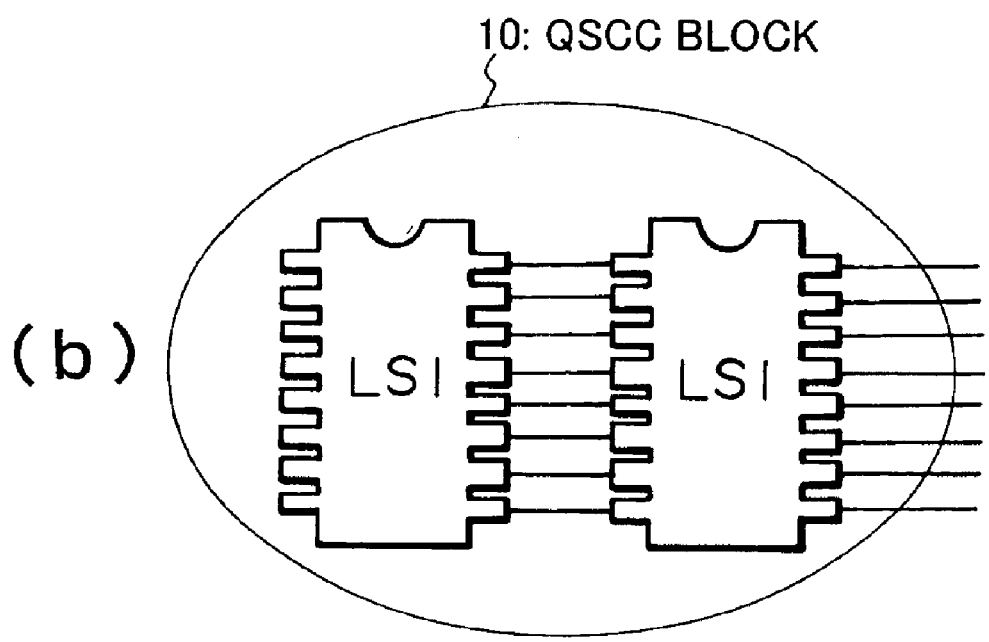
(b)

METHOD AND SYSTEM FOR DESIGNING CIRCUIT LAYOUT

TECHNICAL FIELD

The present invention relates to a circuit layout design method and a system for the circuit layout design method. More specifically, the present invention relates to a circuit layout design method for a digital printed circuit board and an LSI (large scale integrated) circuit on which high-speed, high-frequency circuit devices are mainly mounted.

BACKGROUND ART

As for the conventional digital circuit design system, an LSI circuit design system and a printed circuit board (PCB) circuit design system have existed independently of each other, and an integrated EDA (electronic design automation) system from the LSI to the PCB has not existed.

In addition, in the process of the LSI design, no organic connection has been established between process design and logic design and no consistent integrated system has existed. Although information such as know-how's have been provided to take measures against EMI (electromagnetic interference), no consideration has been given to such an electromagnetic free design technique as to be able to be incorporated into the EDA design system.

Meanwhile, in relation to the printed circuit board circuit design system, a simplified design check tool such as an EMI rule checker has existed; however, no basic design rules have been established.

A conventional design technique in relation to a technique for suppressing digital equipment electromagnetic interference will next be described.
1. In designing a digital printed circuit board (PCB), a highly advanced EDA system is used mainly for the logic design. High-rate simulation in a design phase is targeted at logic and delay time.
2. In designing an LSI circuit, a lumped parameter system is responsible for design and analysis without any strict basis. In the lumped parameter system, a lumped parameter-system simulator represented by SPICE (simulation program with integrated circuit emphasis) performs analysis in relation to the electromagnetic interference.
3. Conventionally, attention has been paid to signal wirings so as to tackle electromagnetic interference problems. This is because the signal wirings occupy the most parts of the printed circuit board (PCB) or a semiconductor LSI and high-frequency current exists on the signal wirings. To this end, an electromagnetic radiation simulator which simulates electromagnetic radiation from the PCB including the semiconductor LSI has been developed and put to practical use. However, the electromagnetic radiation simulator has a problem that the simulated electromagnetic radiation greatly differs from actually measured radiation, and the cause of the problem has not been cleared up. On the other hand, thanks to a recent study, it has been discovered for the first time that the major cause of the electromagnetic radiation from a digital equipment lies in a power supply circuit. For example, it has been discovered that it is possible to suppress electromagnetic radiation over the entire frequency band by 5 dB or more only by changing the power distribution of the PCB from conventional flat plate power distribution to wiring power distribution (see Japanese Patent Laid-Open Application Publication Nos. 9-139573 (to be referred to as "Document 1" hereinafter) and 11-40915 (to be referred to as "Document 2" hereinafter)). In addition, a chip capacitor conventionally used as a decoupling capacitor has its own resonance frequency in a low frequency band and has a problem of being incapable of following the speeding up. To solve this problem, a line component that decreases the impedance of a power supply line to a high frequency range has been invented (see Japanese Patent Laid-Open Application Publication No. 2001-119154 (to be referred to as "Document 3" hereinafter).

DISCLOSURE OF INVENTION

The digitization of electronic equipment increasingly progresses. For a logic design region, which occupies large parts of electronic equipment design, CAE (Computer Aided Engineering) design covering design through manufacturing widely spreads and greatly contributes to the improvement of the quality and efficiency of design and manufacturing. However, for a so-called electronic SI (Signal Integrity) region which occupies the remaining parts of the electronic equipment design and which includes packaging, structure, wiring and the like, there is a tendency to rely on the discretion of an engineer involved in design. As a result, an integrated optimum design method for covering design through manufacturing has not been established. In light of the present situations, the conventional arts 1 and 2 (Documents 1 and 2) have the following problems.
1. First, the conventional electromagnetic interference suppression technique is in a field of trouble shooting. A highly advanced EDA system is used for the design of a digital printed circuit board (PCB) mainly in terms of the logic design. The simulation technique related to electromagnetic interference is created in order that not an engineer involved in design but an engineer familiar with the electromagnetic interference uses the technique whenever a problem occurs. Therefore, the first problem with the conventional art is that it is substantially impossible for a design-involved engineer who is not familiar with electromagnetic interference problems to inspect electromagnetic interference in a design phase.
2. Second, a lumped parameter system theory is applied to the LSI circuit design and wave analysis cannot be performed based on the theory. Inside the LSI is designed and analyzed using a lumped parameter system without any strict basis, and analysis related to electromagnetic interference is also performed by a simulator of a lumped parameter system represented by the SPICE. The simulator of this type has a problem of being incapable of dealing with a current as a wave. It is estimated that the frequency of a circuit current including higher harmonics becomes high as compared with the size of a semiconductor LSI in the future. As a result, signals in the LSI and the power supply current of the LSI are reaching a frequency range which may possibly take on the character of waves. Due to this, it is increasingly necessary to make designs and perform circuit simulation while considering a current as a wave. This is the second problem with the conventional art.

It is, therefore, an object of the present invention to provide a circuit layout design method and a circuit layout design system capable of designing an LSI circuit and an electronic circuit board free of electromagnetic interference.

According to the present invention, there is provided a circuit layout design method including: a quasi-stationary circuit reduction step of dividing an entire circuit represented by a net list and a part library into a plurality of quasi-stationary closed circuits having a reduced size so that an intensity of an electromagnetic wave radiated from each of the quasi-stationary closed circuits is not more than a predetermined value; and a wiring constraint condition calculation step of calculating constraint conditions for wirings mutually connecting the plurality of quasi-stationary closed circuits so that the intensity of the electromagnetic wave radiated from each of the wirings is not more than a predetermined value.

The circuit layout design method may further include a layout step of laying out parts and the wirings based on the net list and the parts library while keeping the constraint conditions.

In the circuit layout design method, the quasi-stationary circuit reduction step and the wiring constraint condition calculation step may be executed for each of frequencies in a descending order and executed so that each of the quasi-stationary closed circuits for a certain frequency includes one or more the quasi-stationary closed circuits for a higher frequency than the certain frequency.

In the circuit layout design method, the constraint conditions may include at least a maximum wiring length.

In the circuit layout design method, the quasi-stationary circuit reduction step may include steps of: obtaining a current waveform by a SPICE (a simulation program with integrated circuit emphasis) using a power supply terminal model and one of an IBIS (I/O buffer information specification) model and an IMIC (I/O interface model for integrated circuit) model; Fourier-transforming the current waveform to a current spectrum; and calculating a field intensity spectrum at a distance by dipole antenna radiation or electromagnetic analysis using the current spectrum.

The circuit layout design method may be used for layout design of a printed circuit board.

The circuit layout design method may be used for layout design of a semiconductor device.

The circuit layout design method may be used for integrated design of a semiconductor device and a printed circuit board.

BRIEF DESCRIPTION OF THE DRAWINGS

FIG. 4 is a pattern diagram showing examples of the QSCC block;

BEST MODE FOR CARRYING OUT THE INVENTION

Figure 1:
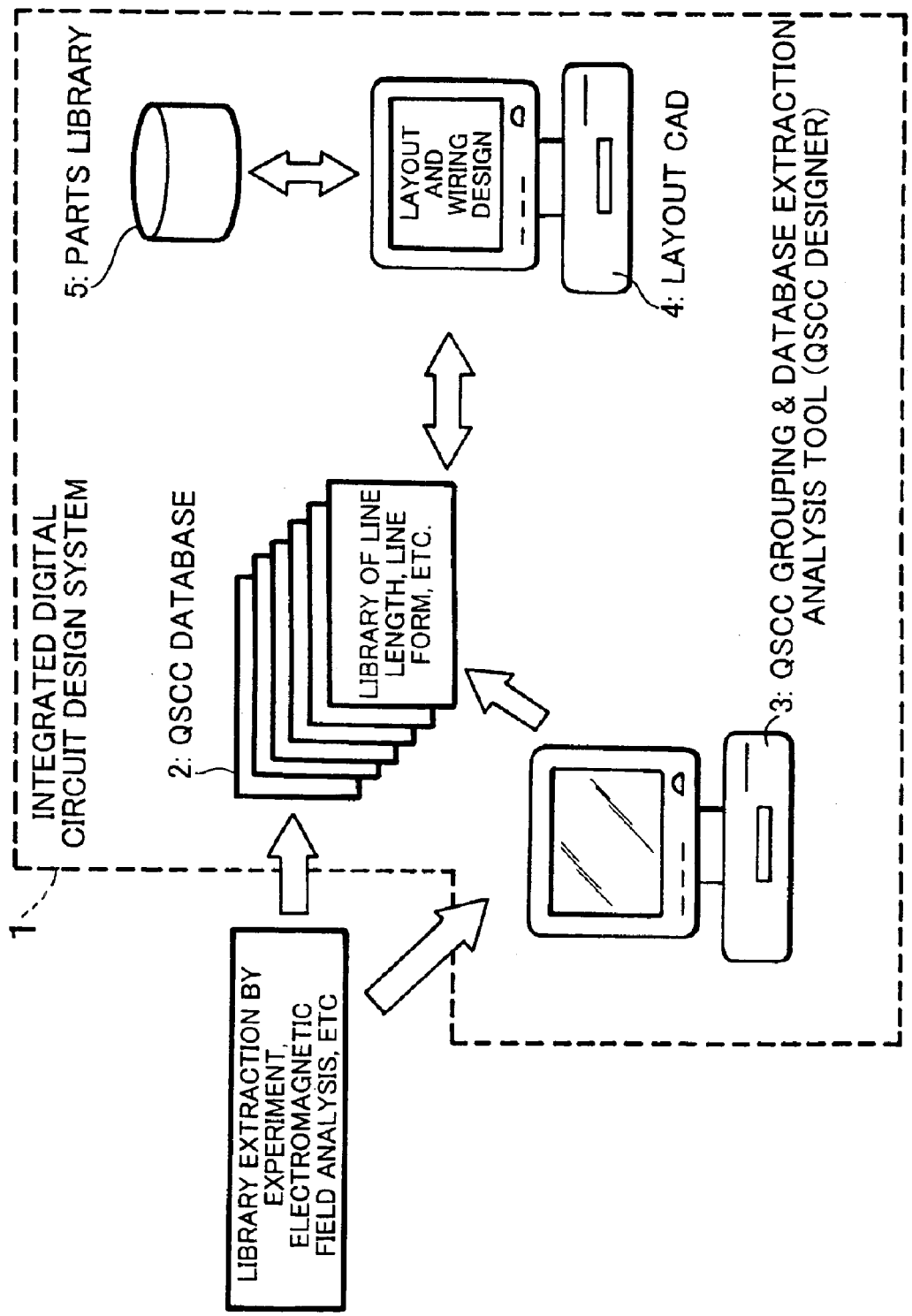
FIG. 1 is a conceptual view of the best mode embodiment of a circuit layout design system according to the present invention.

The outline of the present invention will first be described.
1. An EDA system incorporating therein an electromagnetic interference suppression function is developed, and a design environment capable of designing a digital circuit having an electromagnetic interference suppression effect without being aware of electromagnetic interference suppression is established. A completely novel concept of a quasi-stationary closed circuit (QSCC) that the present invention newly proposes is incorporated in the highly advanced EDA system centering on the conventional logic design, whereby it is possible to design a digital printed circuit board and a semiconductor LSI free of electromagnetic interference. A simulator related to electromagnetic interference according to the present invention is used for real-time inspection in a design phase and has the same function as that of a logic simulator for the conventional EDA system. The electromagnetic interference-related simulator developed from such viewpoints is novel and different from existing simulators. A database system plays an important role in the system developed. This database system is created based on a completely new concept. The database consists of a QSCC and a signal/power supply line, and is created using detailed parameters of semiconductors and components through a novel dedicated tool. The QSCC is provided with an impedance source model per power supply terminal or signal terminal as well as logic and physical interfaces. According to the present invention, another invention filed by the applicant of the present application (Japanese Patent Laid-Open Application Publication No. 2001-222573 (to be referred to as "Document 4" hereinafter) is applied to the power supply terminal model and an IBIS (I/O buffer information specification) already used for simulation or an IMIC (I/O interface model for integrated circuit) which is an improved IBIS is applied to the signal terminal model.

The techniques disclosed in Document 4 will be summarized as follows. The technique of Document 4 relates to the power supply model of an EMI simulation semiconductor integrated circuit, which model is targeted at a printed circuit board and a semiconductor integrated circuit. The power supply model comprises an inverter section to which power is supplied, and an equivalent internal capacitance section connected between the output of this inverter section and the power supply thereof.

According to the technique of Document 4, the interior of the entire LSI is expressed in the form of transistor description. The technique of Document 4 is intended to simulate a radiation field generated on a printed circuit board. The number of transistors which constitute this LSI power supply model in the form of transistor description is far smaller than the number of actually used transistors. The EMI simulator obtains a power supply current carried through the printed wiring board using this model. This model is created by extracting sections that are operating from the net list of the actual LSI, and, as described above, decreasing the number of transistors. In addition, the remaining sections that are not operating are simplified, thus creating an LSI power supply model as a whole.

2. A new circuit design concept that a lumped parameter system is employed in the QSCC and a distributed system is employed outside of the QSCC introduced into design and simulation for the first time. In the example of the semiconductor circuit, the circuit current of each wiring in the semiconductor circuit is obtained by a simulator of a lumped parameter system for each frequency, and the length of the wiring is restricted so that the intensity of an electromagnetic wave radiated from the wiring takes the value which can be substantially ignored. In this analysis, a two-dimensional or three-dimensional electromagnetic simulator is employed to obtain a maximum wiring length for each wiring structure. If a closed circuit not larger than the wiring length thus restricted is taken out, it can be considered that this closed circuit is one of the QSCCs and that an electromagnetically quasi-stationary state is maintained in the closed circuit. Therefore, the simulator of a lumped parameter system can be utilized to analyze the circuit in the QSCC without causing any problems. Further, as lower the frequency is, the larger the allowable wiring length becomes. Due to this, it is possible to ensure applying a circuit theory of a lumped parameter system to the interior of the QSCC in any case, although the allowable wiring length depends on the frequency of the circuit current. On the other hand, if a transmission line structure that is established in the microwave engineering is used for wirings outside of the QSCC used for signal distribution and power supply distribution, it is possible to suppress electromagnetic radiation. Consequently, it is possible to greatly improve design efficiency and design quality.

To attain the above-stated object, the present invention incorporates a completely new concept of the quasi-stationary closed circuit (QSCC) into design tools (such as a simulator and a layout CAD) for a digital printed circuit board and a semiconductor LSI.

The concept of the QSCC that the present invention proposes for the first time for design method free of an electromagnetic interference for digital equipment will be described. Generally, if the wavelength λ of a circuit current is sufficiently large as compared with the size of a closed circuit, electromagnetic radiation is eliminated. In other words, in order to realize a device free of mutual electromagnetic interference problems, it is effective to design all closed circuits to have quasi-stationary states.

The embodiment of the present invention will next be described with reference to the accompanying drawings. FIG. 1 is a conceptual view of the best mode embodiment of a circuit layout design system according to the present invention. This conceptual view includes main constituent elements which can be applied to both the semiconductor LSI design and the circuit layout design. Referring to FIG. 1, the circuit layout design system 1 consists of a QSCC database 2, a QSCC grouping & database extraction analysis tool (to be referred to as "QSCC designer" hereinafter) 3, a layout CAD 4 and a parts library 5.

The QSCC database 2 directly stores rules which satisfy the QSCC concept which are extracted by experts in electromagnetic interference problems through experiment, analysis or the like, or the QSCC database 2 stores rules analyzed/extracted by the QSCC designer 3. The libraries (QSCC rules) stored in the QSCC database 2 are constraint conditions which are set when the layout CAD 4 makes layout and wiring design. A semiconductor LSI or printed circuit board (PCB) designed not to violate the rules (restrictions) satisfies the requirements of the QSCC rules and thus realizes electromagnetic interference free design. To be specific, the QSCC database 2 stores libraries on the allowable maximum wiring length between the QSCC blocks, a line form and the like.

Figure 2:
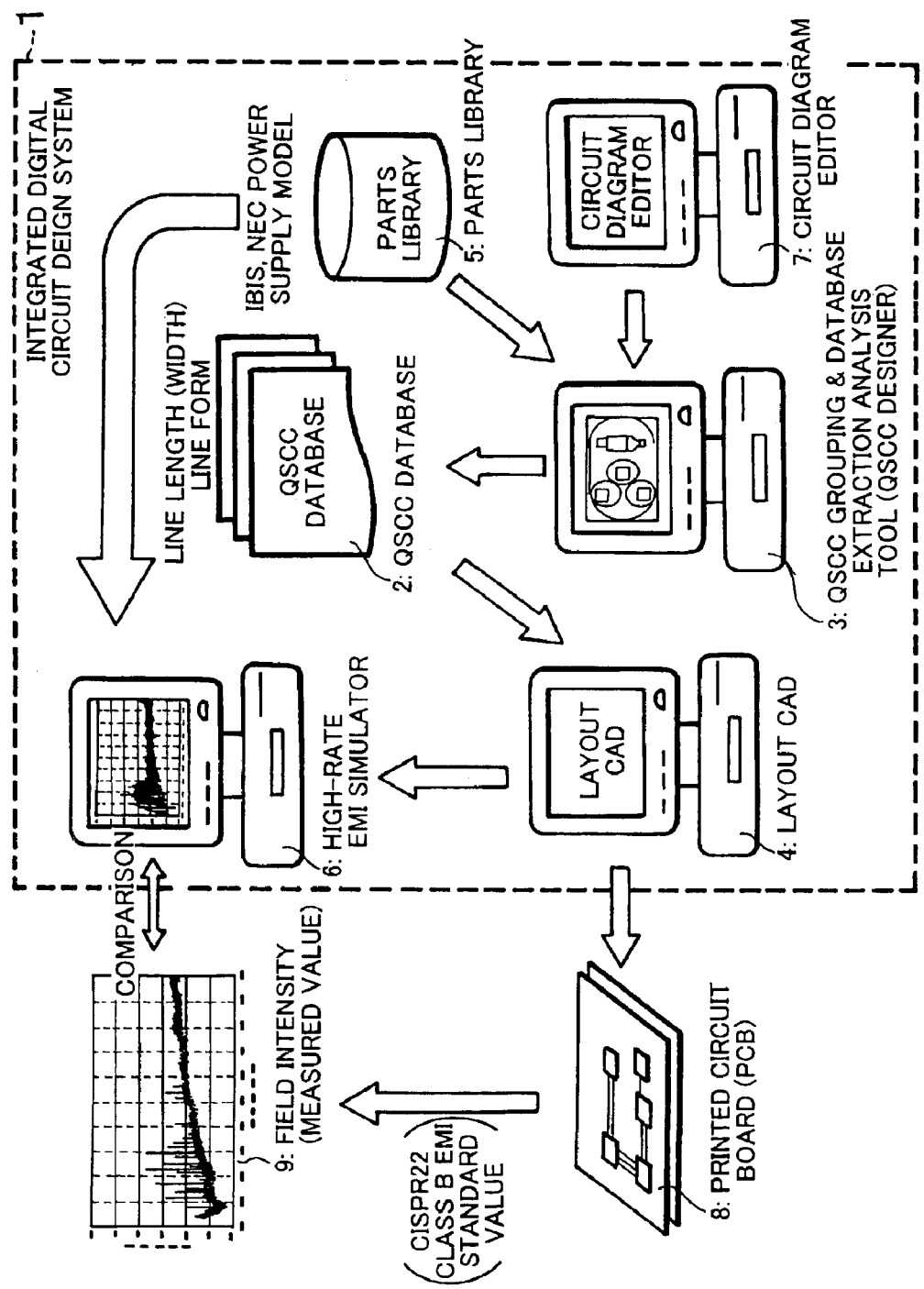
FIG. 2 is a detailed block diagram of the best mode embodiment of the circuit layout design system according to the present invention.

FIG. 2 is a detailed block diagram of the most preferred embodiment of the circuit layout design system according to the present invention. Although the block diagram of FIG. 2 shows the system for printed circuit board (PCB) design, a system for LSI design is basically similar in configuration to the system shown in FIG. 2.

Referring to FIG. 2, the circuit layout design system 1 consists of the QSCC database 2, the QSCC designer 3, the layout CAD 4, the parts library 5, a high-rate EMI simulator 6 and a circuit diagram editor 7.

The QSCC designer 3 inputs a net list which indicates the logic connection of the respective circuit constituent elements and which is supplied from the circuit diagram editor 7 which designs a logic circuit, an IBIS model and an IMIC model (signal terminal) for each semiconductor LSI terminal stored in the parts library 5, and a power supply model as disclosed in Document 4, and extracts QSCC design conditions so as to group the QSCC on a digital circuit and to give restrictions to the placement of parts and routing of parts and the like performed by the layout CAD 4.

The data extracted by the QSCC designer 3 is stored in the QSCC database 2. The QSCC database 2 is connected to the layout CAD 4. The layout CAD 4 executes electromagnetic interference free design while referring to the QSCC database 2, thereby designing the printed circuit board (PCB) 8 based on the QSCC concept.

On the other hand, the CAD data designed by the layout CAD 4 is transferred to the high-rate EMI simulator 6 through a specific interface, and electromagnetic radiation noise is analyzed by the simulator 6 for final design inspection. Further, it is necessary to measure the electric field intensity of the printed circuit board (PCB) 8 manufactured using the layout CAD 4 in a qualified radio wave darkroom or an open site so as to determine whether the PCB 8 satisfies the international or domestic EMI standard. Therefore, it is effective to analyze the electromagnetic radiation noise by the high-rate EMI simulator 6 in advance for real-time inspection for the design.

To extract the power supply model of the semiconductor LSI stored in the parts library 5 (as described in Document 4), there are an extraction method by transforming the SPICE model of the LSI itself and an extraction method by measuring the high frequency power supply current spectrum of the LSI using a magnetic field (current) probe, transforming the measured spectrum to a time-axis waveform, and thereby constructing a model.

Figure 3:
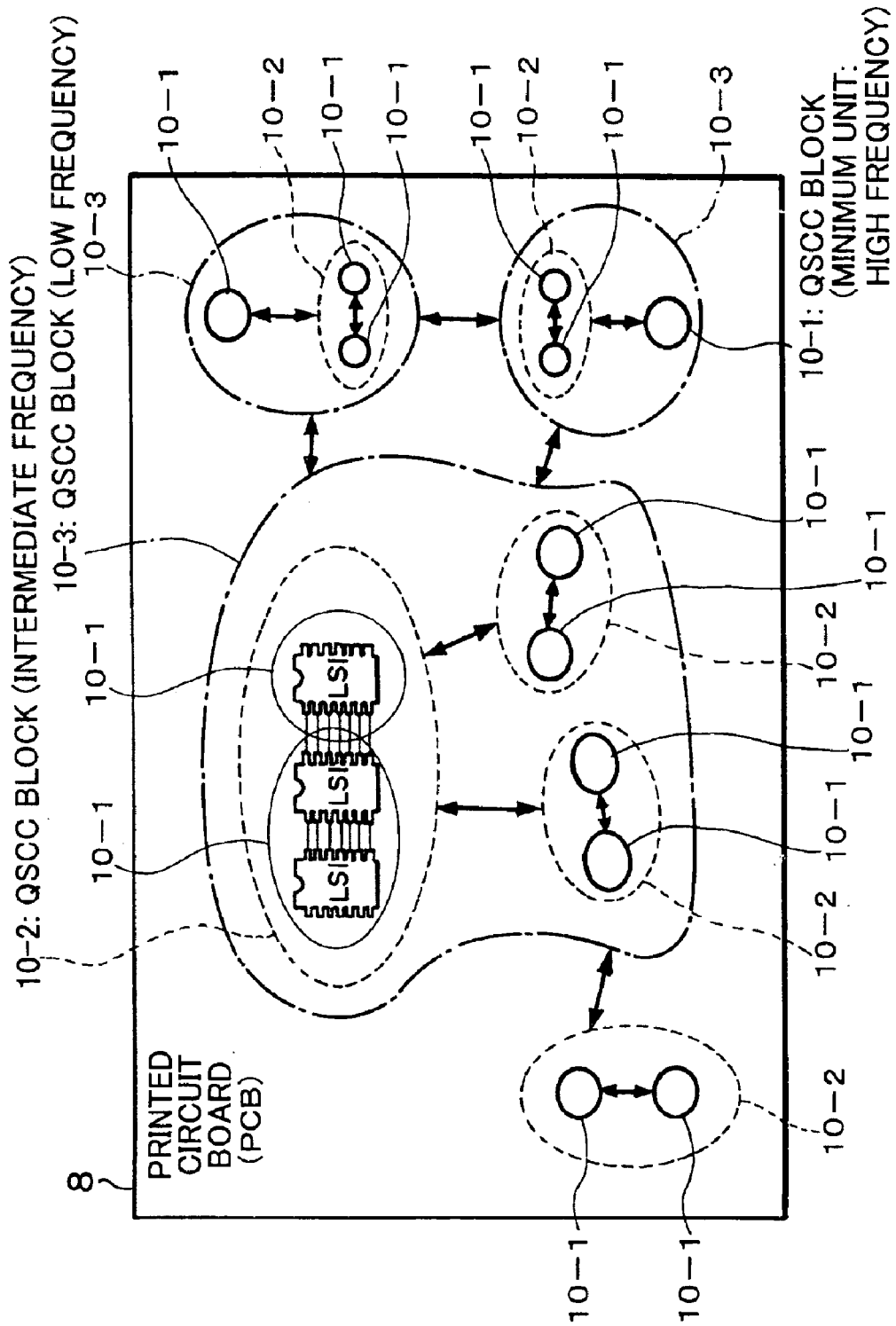
FIG. 3 is a pattern diagram showing one example of grouping an entire printed circuit board (PCB) into quasi-stationary closed circuit (QSCC) blocks.

FIG. 3 is a typical view showing one example of grouping overall devices on the printed circuit board (PCB) 8 to QSCC blocks. In FIG. 3, the minimum unit of the QSCC blocks is an LSI and LISs on the PCB 8 are grouped according to three frequencies. Referring to FIG. 3, the LSIs are grouped into QSCC blocks 10-1 (high-rate blocks) in the highest hierarchy according to the highest frequency among the three frequencies using an algorithm according to the present invention (see FIGS. 7 and 8 to be described later). Next, with the resultant QSCC blocks 10-1 according to the highest frequency set as units, the LSIs are grouped according to the second highest frequency (intermediate-rate frequency) to thereby generate larger QSCC blocks 10-2 than the QSCC blocks 10-1. Finally, with the QSCC blocks 10-2 set as units, the LSIs are grouped according to the lowest frequency to thereby generate larger QSCC blocks 10-3 than the QSCC blocks 10-2.

In this example, the LSIs are grouped according to the three frequencies. However, the number of points of analysis frequencies used for grouping is not limited to three but may be any arbitrary number.

According to the concept of the quasi-stationary closed circuit (QSCC) stated above, it is obvious that the higher the frequency is, the smaller the sizes of the QSCC blocks become. In this way, the grouping of the LSIs into the QSCC blocks is executed in a plurality of hierarchies according to operating frequencies and the grouping is continued until all the LSIs mounted on the printed circuit board (PCB) 8 are included in one QSCC block.

According to the QSCC theory, there is no electromagnetic radiation from each QSCC block and it suffices to consider only electromagnetic radiation from the respective lines connecting the QSCC blocks. Due to this, radiation from each transmission line is analyzed, and the PCB 8 is designed based on the restrictions to the layout and wiring design so as to satisfy an EMI standard value with a certain margin, whereby the entire printed circuit board (PCB) 8 free of electromagnetic interference is designed.

Further, the transmission lines are classified to signal wirings and power supply wirings (noted that the power supply circuit has a default to be wired as stated above). The recent study obviously shows that the greatest cause of the electromagnetic interference derived from digital equipment lies in the power supply circuit. Therefore, by adopting line components that decrease the impedance of the power supply line in the high frequency range as described in the invention (Document 3) of the applicant of the present application so as to intensify decoupling for the power supply wirings which are the greatest cause of the electromagnetic interference, it is possible to efficiently, considerably suppress the electromagnetic interference from the power supply line. Accordingly, it suffices to execute designing the PCB 8 while paying greater attention to the electromagnetic interference from the signal wirings.

FIG. 4 is a typical view showing examples of the QSCC blocks. FIG. 4 shows a case in which the minimum unit of the QSCC blocks is an LSI. Depending on the operating frequency of the LSI, a QSCC block consists of one LSI (see FIG. (*a*)) or a plurality of (two in FIG. 4(*b*)) LSIs.

Figure 5:
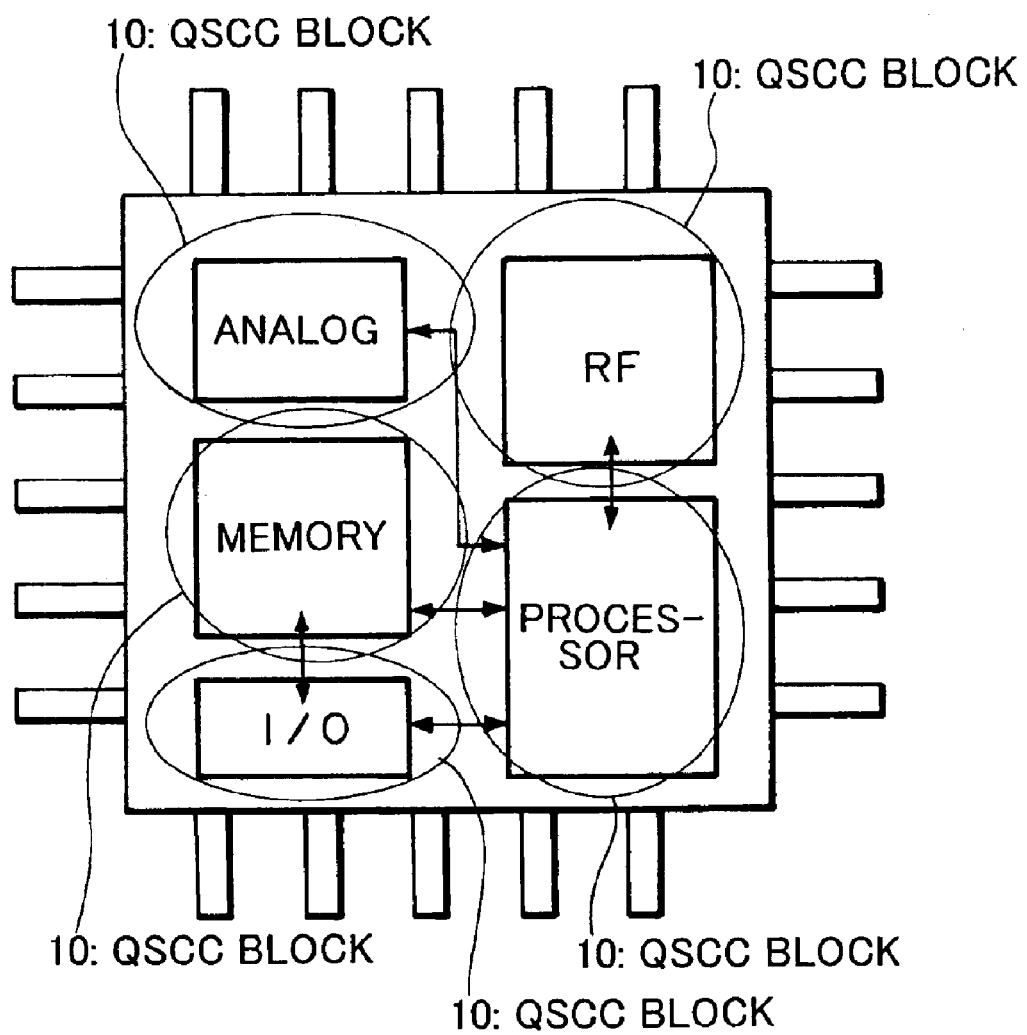
FIG. 5 is a pattern diagram showing one example of extending the minimum unit of the QSCC block to a functional block in an LSI.

FIG. 5 is a typical view showing one example of extending the minimum units of the QSCC blocks from the LSI to functional blocks in the LSI. It is estimated that if the rate of a semiconductor device is rapidly accelerated and shifting to an SOC (System on Chip), then it is difficult to create QSCC blocks according to the units of the LSIs and it is, therefore, necessary to form QSCC blocks according to smaller units, i.e., the internal elements of the LSI. Although the drawings and the description of the specification are centered on the example of setting an LSI as the minimum unit of the QSCC blocks, the minimum unit of the QSCC blocks is not limited to the LSI but may be the internal functional block of the LSI as shown in FIG. 5.

Figure 6:
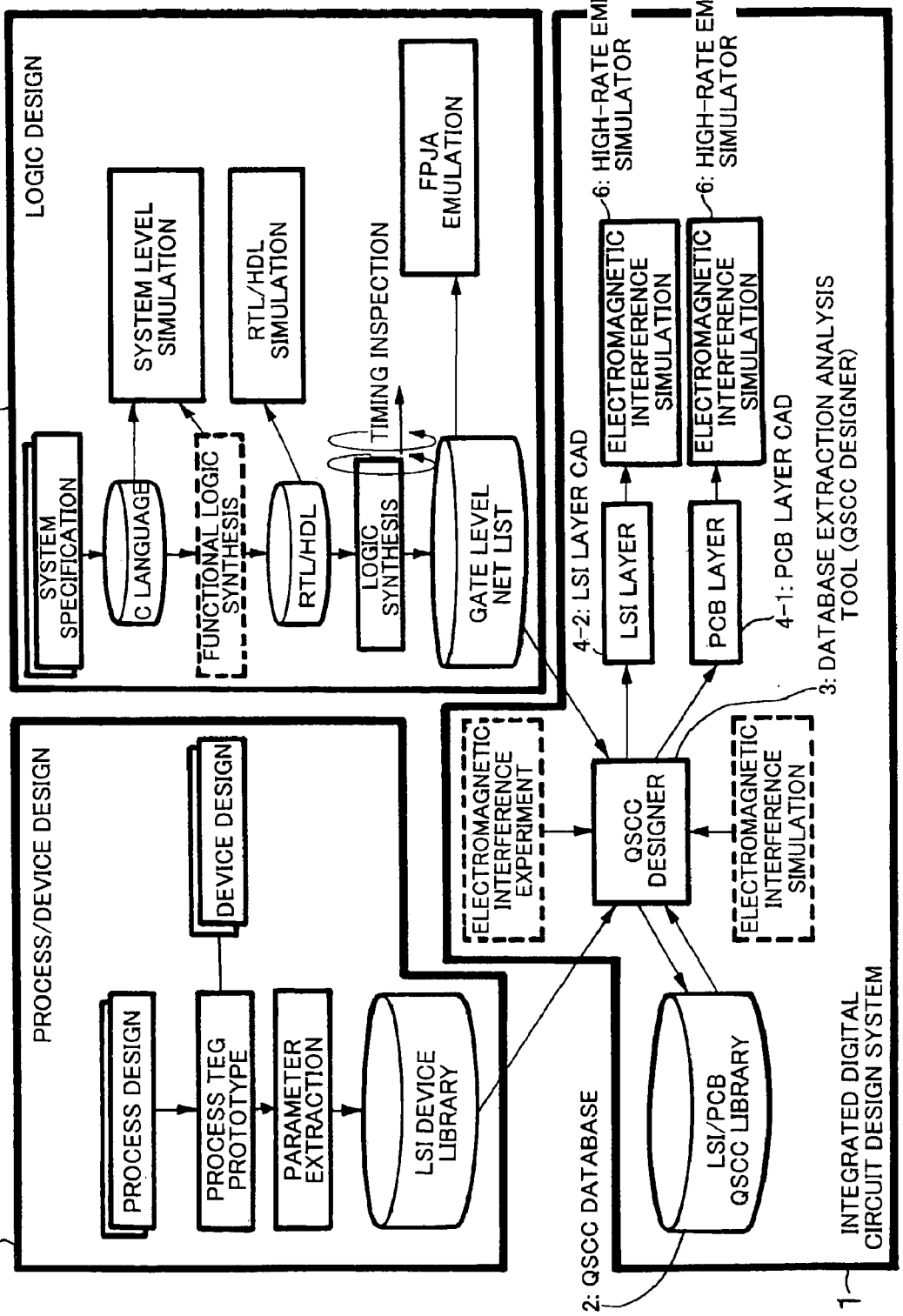
FIG. 6 shows the concept of a design flow executed by the circuit layout design system according to the present invention.

FIG. 6 shows the concept of a design flow executed by the circuit layout design system according to the present invention. Conventionally, the organic connection between the process/device design section 11 and the logic design section 12 has not been established as the integrated EDA system and no drastic electromagnetic interference free design rules have been, therefore, established.

In the circuit layout design system 1 according to the present invention, by contrast, the process design section 11 can be connected to the logic design section 12 as the integrated EDA system and electromagnetic interference free design can be realized. In addition, the QSCC designer 3 plays a central role in the circuit layout design system 1. The QSCC designer 3 executes layout design and wiring design based on various QSCC libraries (rules) stored in the QSCC database 2 and the high-rate EMI simulator 6 executes real-time inspection and analysis for the design.

Figure 7:
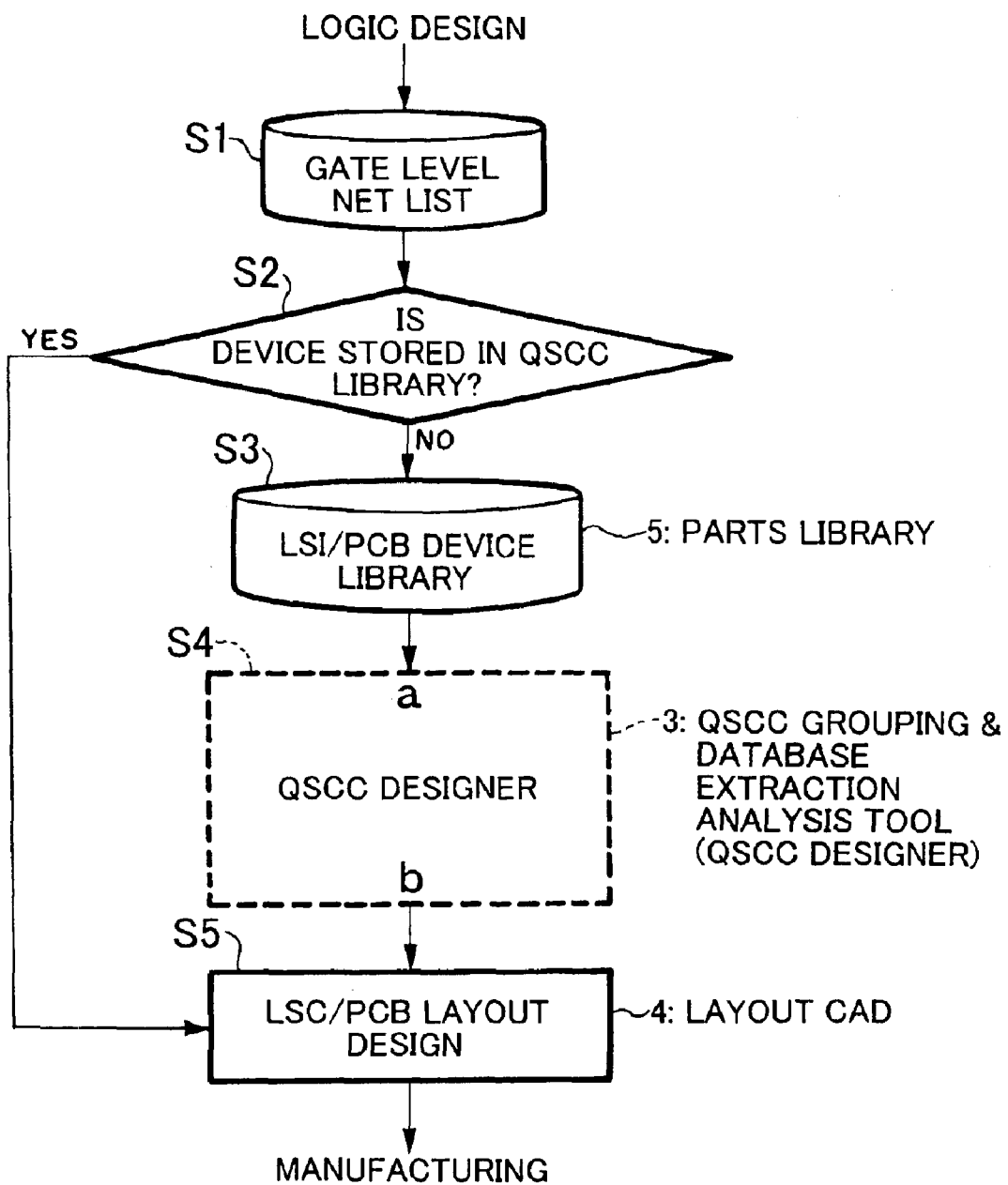
FIG. 7 is a flow chart showing an overall circuit layout design method according to the present invention.
Figure 8:
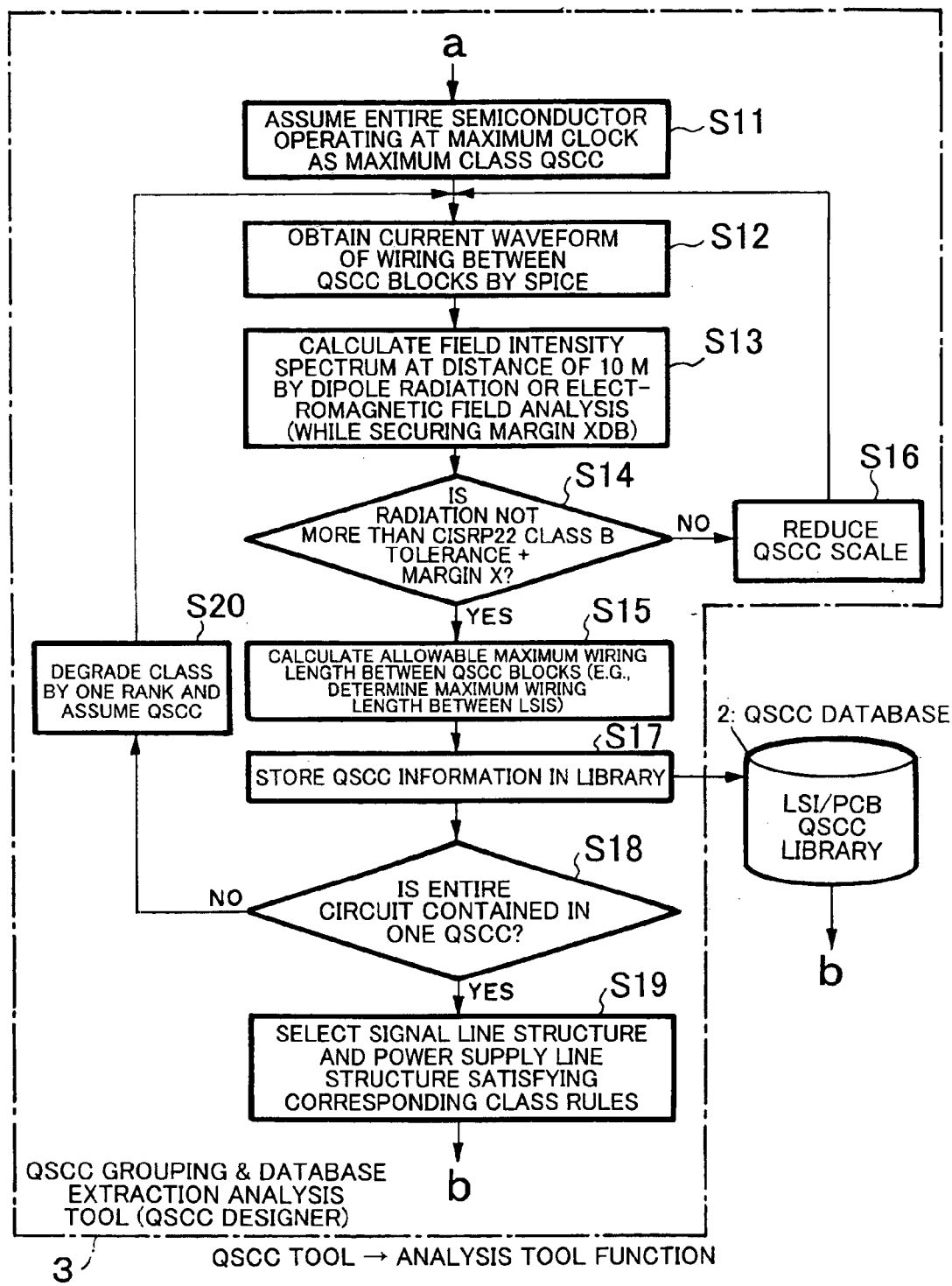
FIG. 8 is a flow chart showing the overall circuit design layout method executed by a QSCC designer.

FIG. 7 is a schematic diagram showing an entire QSCC design flow, and FIG. 8 is a schematic diagram showing a design flow executed by the QSCC designer 3. The QSCC design flow will first be described. Referring to FIG. 7, a net list is extracted from the logic design data (in a step S1), and it is searched whether the device (i.e., the QSCC block) is already registered with the parts library 5 (in a step S2). If it is already registered ("Yes" in the step S2), it means that rules satisfying the QSCC requirements exist. Therefore, the processing moves to layout design executed by the layout CAD 4 (a step S5). If the device is not registered with the parts library 5 ("No" in the step S2), the device is registered as a new device with the library 5 (in a step S3). The processing moves to a step executed by the QSCC designer 3, which adds QSCC rules (a step S4), and the processing then moves to a step executed by the layout design section (a step S5). The QSCC rules analyzed by the QSCC designer 3 are stored in the QSCC database 2 and used as later design information.

Next, the design flow executed by the QSCC designer 3 shown in FIG. 8 will be described. Referring to FIG. 8, the basic functions of the QSCC designer 3 include a function of grouping the devices into QSCC blocks based on a certain algorithm, a function of analyzing the electromagnetic interference of the transmission lines connecting the QSCC blocks, extracting parameters (e.g., a maximum allowable line length) to be set as CAD design constraint conditions, and registering the extracted parameters with the database.

It is noted that FIG. 8 shows an example in which the LSI is a minimum unit of the QSCC blocks. First, an LSI that operates at the highest clock is assumed as the highest class (hierarchy) QSCC (in a step S11). Then, the current waveforms of the wirings between the QSCC blocks are obtained by the SPICE (in a step S12). To obtain a current waveform, the current waveform analyzed by the SPICE is subjected to Fourier transform using the IBIS model (or IMIC model) (signal terminal) and the NEC power supply model (power supply terminal) for each terminal of the LSIs stored in the parts library 5, and a current spectrum is obtained.

When the current spectrum is obtained, a field intensity spectrum at a distant location (e.g., at a distance of 10 m) is calculated by dipole antenna radiation or electromagnetic field analysis (in a step S13). Through this electromagnetic field analysis (transmission line analysis), a highly accurate distant field intensity is calculated. The reason for using the dipole antenna radiation is that normal mode (differential mode) radiation is basically not present or negligibly small on an ideal transmission line (e.g., a micro-strip line). This is because a current carried across the line also flows as a feedback current on a flat plane, such as a closest ground layer, with an opposite phase, so that electromagnetic fields cancel each other. However, it does not necessarily mean that 100% of the normal mode current returns as the feedback current but only part of the normal mode current is transformed to a common mode current, which causes common mode radiation which is said to dominate the electromagnetic radiation. This is why the electric dipole antenna radiation which can approximate the common mode radiation is utilized.

Next, it is determined whether the radiation from the line satisfies a standard tolerance (which is an international standard of CISPR22 ITE Class B in the example of FIG. 8) with a certain margin XdB (variable) (in a step S14). If the field intensity spectrum obtained falls within the range of 'tolerance+margin' ("Yes" in the step S14), an allowable maximum wiring length between the QSCC blocks is calculated (in a step S15). The maximum allowable wiring length can be easily calculated based on the parameters for the dipole antenna radiation. The LSIs can be thus grouped into the QSCC block in that class. Thereafter, the grouping class information and the maximum wiring length are stored in the QSCC database 2 (in a step S17).

On the other hand, if the field intensity spectrum does not fall within the range of 'tolerance+margin' ("No" in the step S14), QSCC grouping scale is reduced. The processing returns to the step S12 and the electromagnetic field analysis is re-executed (in a step S16). The processing is continued while reducing the QSCC grouping scale until the field intensity spectrum belongs to one QSCC block in the class.

If grouping in certain classes (in the descending order of hierarchy) is completed, it is determined whether all the devices (LSIs) on the circuit fall within one QSCC block of the QSCC database 2 (in a step S18). If all the devices belongs to one QSCC block ("Yes" in the step S18), a signal line structure and a wiring line structure satisfying QSCC rules for the corresponding class are selected from the parts library 5 (in a step S19) and the processing moves to CAD design.

If all the devices, i.e., the entire circuit is not contained in one QSCC ("No" in the step S18), the QSCC class is degraded by one rank (i.e., a clock frequency is lowered by one rank) and the QSCC block is assumed (in a step S20). In other words, devices are grouped into a plurality of QSCC hierarchies (QSCC classes) according to clock frequencies. First, the devices are grouped according to the class of the highest hierarchy (the highest clock frequency). If the entire circuit is not contained in one QSCC, grouping is re-executed in a hierarchy (clock frequency) degraded by one rank. The same routine is repeated until all the devices on the circuit belong to one QSCC.

As already described, there is no radiation from the QSCC blocks themselves. Due to this, if larger QSCC blocks are sequentially constructed using an algorithm that the radiation of the lines connecting the QSCC blocks has a certain electromagnetic radiation margin, the overall printed circuit board is grouped into QSCC blocks as shown in FIG. 3, making it possible to realize consistent electromagnetic interference free design.

Figure 9:
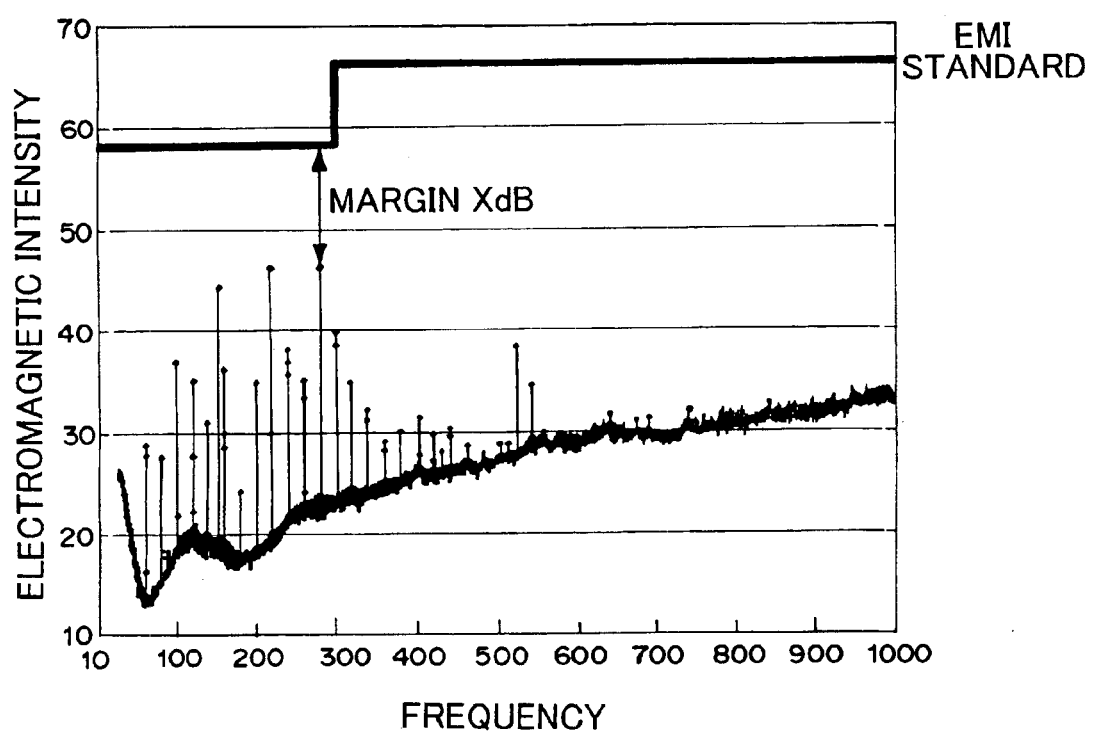
FIG. 9 shows one example of an electric field spectrum as a result of electromagnetic field analysis.

FIG. 9 shows one example of an electric field spectrum as a result of the electromagnetic field analysis. FIG. 9 shows the definition of the margin relative to an EMI standard value. Namely, the EMI standard value shown in FIG. 9 corresponds to the "tolerance" (see the step S14) and "tolerance+margin X" corresponds to a field intensity lower than this EMI standard value by XdB.

Figure 10:
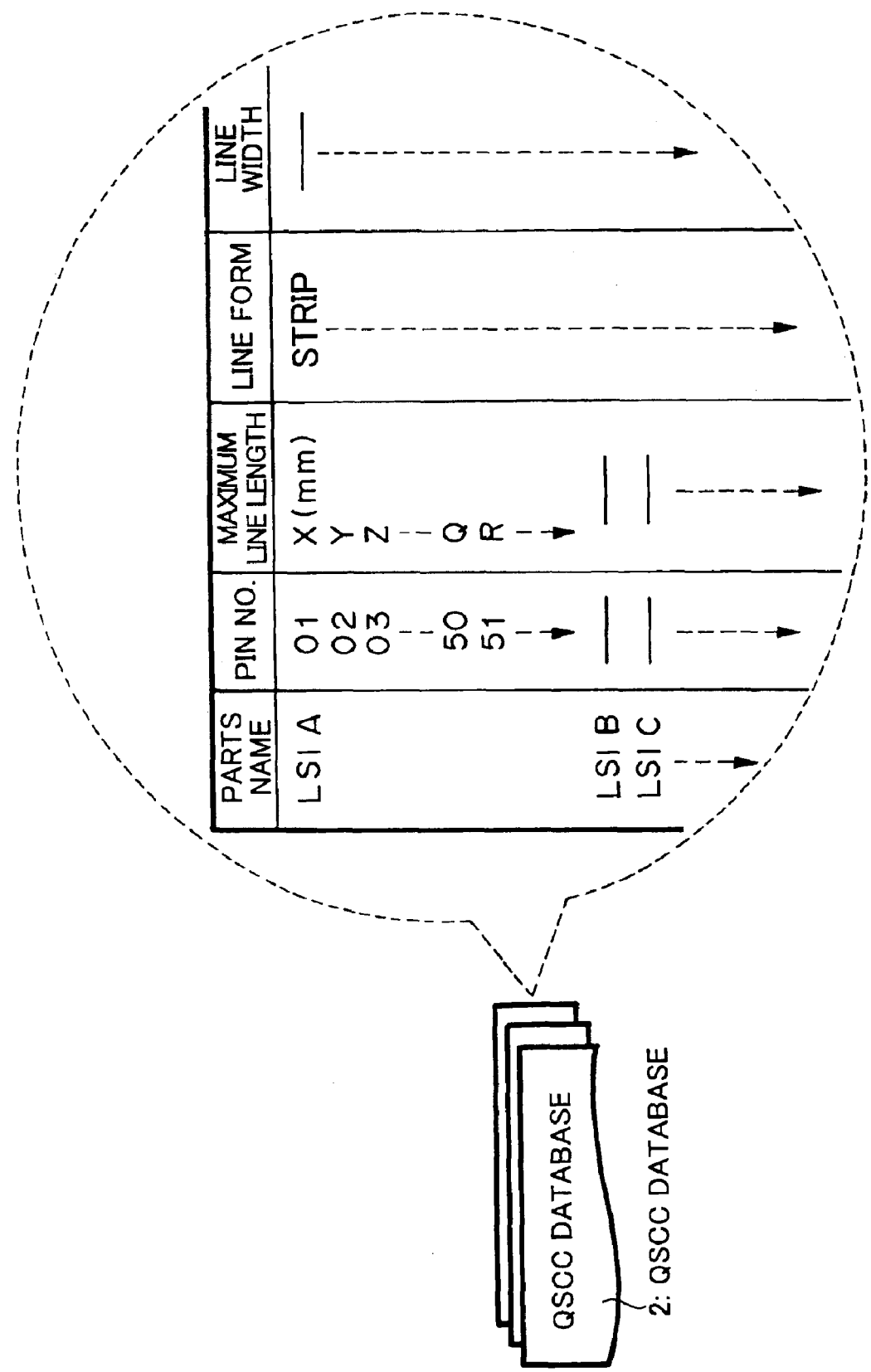
FIG. 10 shows one example of a QSCC database.

FIG. 10 shows one example of the QSCC database 2. This database 2 is an example of the database in a case in which an LSI is the minimum unit of the QSCC blocks. The QSCC database 2 takes a form of the parts list created for the terminals of each LSI and includes QSCC conditions allocated to each terminal of each LSI. The database 2 is connected to the layout CAD 4 and the conditions in the database 2 are used by the layout CAD 4 as those for giving some restrictions to parts placement design, wiring design and the like from QSCC viewpoints. In FIG. 10, an example of allocating an allowable maximum line length, a line form and a line width to each terminal of each LSI is shown. However, the conditions are not limited thereto.

It is noted that a control program shown in the flow charts of FIGS. 7 and 8 can be recorded on a recording medium (not shown) in advance and read from the recording medium to an external processor (not shown) and that the above-stated circuit layout design method can be executed by the QSCC designer 3, the layout CAD 4, the circuit diagram editor 7 and the high-rate EMI simulator 6 according to the control program.

INDUSTRIAL APPLICABILITY

The present invention can be utilized for the design of the LSI circuit, the electronic circuit board and the like which are free of electromagnetic interference.

What is claimed is:

1. A circuit layout design method comprising:
    a quasi-stationary circuit reduction step of dividing an entire circuit represented by a net list and a part library into a plurality of quasi-stationary closed circuits having a reduced size so that an intensity of an electromagnetic wave radiated from each of the quasi-stationary closed circuits is not more than a predetermined value; and
    a wiring constraint condition calculation step of calculating constraint conditions for each of wirings mutually connecting said plurality of quasi-stationary closed circuits so that the intensity of the electromagnetic wave radiated from each of the wirings is not more than the predetermined value.

2. The circuit layout design method according to claim 1, further comprising:
    a layout step of laying out parts and the wirings based on said net list and said parts library so as to satisfy said constraint conditions.

3. The circuit layout design method according to claim 1, wherein said quasi-stationary circuit reduction step and said wiring constraint condition calculation step are executed for each of frequencies in a descending order and executed so that each of said quasi-stationary closed circuits for a certain frequency includes one or more said quasi-stationary closed circuits for a higher frequency than the certain frequency.

4. The circuit layout design method according to claim 1, wherein said constraint conditions include at least a maximum wiring length.

5. The circuit layout design method according to claim 1, wherein said quasi-stationary circuit reduction step includes steps of:
    obtaining a current waveform by a SPICE (a simulation program with integrated circuit emphasis) using a power supply terminal model and one of an IBIS (I/O buffer information specification) model and an IMIC (I/O interface model for integrated circuit) model;
    Fourier-transforming said current waveform to a current spectrum; and
    calculating a field intensity spectrum at a distance by dipole antenna radiation or electromagnetic analysis using the current spectrum.

6. The circuit layout design method according to claim 1, wherein the method is used for layout design of a printed circuit board.

7. The circuit layout design method according to claim 1, wherein the method is used for layout design of a semiconductor device.

8. The circuit layout design method according to claim 1, wherein the method is used for integrated design of a semiconductor device and a printed circuit board.

9. A circuit layout design system comprising:
    quasi-stationary circuit reduction means for dividing an entire circuit represented by a net list and a part library into a plurality of quasi-stationary closed circuits having a reduced size so that an intensity of an electromagnetic wave radiated from each of the quasi-stationary closed circuits is not more than a predetermined value; and
    wiring constraint condition calculation means for calculating constraint conditions for each of wirings mutually connecting said plurality of quasi-stationary closed circuits so that the intensity of the electromagnetic wave radiated from each of the wirings is not more than the predetermined value.

10. The circuit layout design system according to claim 9, further comprising:
    layout means for laying out parts and the wirings based on said net list and said parts library so as to satisfy said constraint conditions.

11. The circuit layout design system according to claim 9 or, wherein said quasi-stationary circuit reduction means and said wiring constraint condition calculation means operate for each of frequencies in a descending order and operate so that each of said quasi-stationary closed circuits for a certain frequency includes one or more said quasi-stationary closed circuits for a higher frequency than the certain frequency.

12. The circuit layout design system according to any one of claims 9 to 11, wherein said constraint conditions include at least a maximum wiring length.

13. The circuit layout design system according to claim 9, wherein said quasi-stationary circuit reduction means includes:
   means for obtaining a current waveform by a SPICE (a simulation program with integrated circuit emphasis) using a power supply terminal model and one of an IBIS (I/O buffer information specification) model and an IMIC (I/O interface model for integrated circuit) model;
   means for Fourier-transforming said current waveform to a current spectrum; and
   means for calculating a field intensity spectrum at a distance by dipole antenna radiation or electromagnetic analysis using the current spectrum.

14. The circuit layout design system according to claim 9, wherein the system is used for layout design of a printed circuit board.

15. The circuit layout design system according to claim 9, wherein the system is used for layout design of a semiconductor device.

16. The circuit layout design system according to claim 9, wherein the system is used for integrated design of a semiconductor device and a printed circuit board.

17. A recording medium recording a program for allowing a computer to execute a circuit layout design method comprising:
   a quasi-stationary circuit reduction step of dividing an entire circuit represented in a net list and a part library into a plurality of quasi-stationary closed circuits having a reduced size so that an intensity of an electromagnetic wave radiated from each of the quasi-stationary closed circuits is not more than a predetermined value; and
   a wiring constraint condition calculation step of calculating constraint conditions for each of wirings mutually connecting said plurality of quasi-stationary closed circuits so that the intensity of the electromagnetic wave radiated from each of the wirings is not more than the predetermined value.

18. The recording medium according to claim 17, wherein the method further comprises:
   a layout step of laying out parts and the wirings based on said net list and said parts library so as to satisfy said constraint conditions.

19. The recording medium according to claim 17, wherein in the method, said quasi-stationary circuit reduction step and said wiring constraint condition calculation step are executed for each of frequencies in a descending order and executed so that each of said quasi-stationary closed circuits for a certain frequency includes one or more said quasi-stationary closed circuits for a higher frequency than the certain frequency.

20. The recording medium according to claim 17, wherein said constraint conditions include at least a maximum wiring length.

21. The recording medium according to claim 17, wherein said quasi-stationary circuit reduction step includes steps of:
   obtaining a current waveform by a SPICE (a simulation program with integrated circuit emphasis) using a power supply terminal model and one of an IBIS (I/O buffer information specification) model and an IMIC (I/O interface model for integrated circuit) model;
   Fourier-transforming said current waveform to a current spectrum; and
   calculating a field intensity spectrum at a distance by dipole antenna radiation or electromagnetic analysis using the current spectrum.

22. The recording medium according to claim 17, wherein the method is used for layout design of a printed circuit board.

23. The recording medium according to claim 17, wherein the method is used for layout design of a semiconductor device.

24. The recording medium according to claim 17, wherein the method is used for integrated design of a semiconductor device and a printed circuit board.

* * * * *